United States Patent [19]

Hosoi et al.

[11] Patent Number: 4,908,074
[45] Date of Patent: Mar. 13, 1990

[54] GALLIUM ARSENIDE ON SAPPHIRE HETEROSTRUCTURE

[75] Inventors: Takashi Hosoi; Kokichi Ishibitsu, both of Youkaichi, Japan

[73] Assignee: Kyocera Corporation, Kyoto, Japan

[21] Appl. No.: 281,937

[22] Filed: Dec. 6, 1988

Related U.S. Application Data

[63] Continuation of Ser. No. 20,103, Feb. 27, 1987, abandoned.

[30] Foreign Application Priority Data

Feb. 28, 1986 [JP] Japan .................................. 61-44973
Mar. 31, 1986 [JP] Japan .................................. 61-75268

[51] Int. Cl.$^4$ ..................... H01L 29/30; H01L 29/12
[52] U.S. Cl. .................................. 148/33.2; 148/33.4; 148/DIG. 25; 148/DIG. 56; 148/DIG. 72; 148/DIG. 97; 156/610; 437/84; 437/112; 437/126

[56] References Cited

U.S. PATENT DOCUMENTS

| | | | |
|---|---|---|---|
| 3,146,137 | 8/1964 | Williams | 437/93 |
| 3,325,314 | 6/1967 | Allegretti | 437/93 |
| 3,698,944 | 10/1972 | Dyer | 156/612 |
| 3,788,890 | 1/1974 | Mader et al. | 437/93 |
| 3,864,162 | 2/1975 | Kenty | 156/612 |
| 4,066,481 | 1/1978 | Manasevit et al. | 437/84 |
| 4,177,321 | 12/1979 | Nishizawa | 437/976 |
| 4,368,098 | 1/1983 | Manasevit | 156/610 |
| 4,404,265 | 9/1983 | Manasevit | 156/611 |
| 4,422,888 | 12/1983 | Stutius | 437/81 |
| 4,447,497 | 5/1984 | Manasevit | 156/612 |
| 4,561,916 | 12/1985 | Akiyama et al. | 437/132 |
| 4,588,451 | 5/1986 | Vernon | 437/126 |

FOREIGN PATENT DOCUMENTS

026100 2/1983 Japan .

OTHER PUBLICATIONS

Thorsen et al., "Heteroepitaxial GaAs on Aluminum Oxide . . . ", J. Applied Phys. vol. 42, No. 6, May 1971, pp. 2519-2527.

Manasevit, "Recollections and Reflections of MOCVD," J. Crystal Growth, vol. 55, 1981, pp. 1–9.
Sugimura et al., "Heteroepitaxial Growth of GaAs on Sapphire Substrates . . . by Low Pressure MOCVD", J. Crys. Growth, 77 (1986), pp. 524–529.

(List continued on next page.)

*Primary Examiner*—Brian E. Hearn
*Assistant Examiner*—William Bunch
*Attorney, Agent, or Firm*—Spensley Horn Jubas & Lubitz

[57] ABSTRACT

Disclosed is a process for the production of a semiconductor element by introducing a gas of an organic metal compound of an element of the group III and a gas containing an element of the group V into a reaction chamber in which a substrate of a single crystal of alumina is arranged and epitaxially growing a III.V compound semiconductor by the thermal decomposition vapor deposition of the compound of the elements of the groups III.V, said process comprises, in combination, the steps of (A) heating the substrate at a temperature of 400° to 550° C., introducing the gas of the organic metal compound of the element of the group III and the gas containing the element of the group V into the reaction chamber and forming a film of a compound of the elements of the groups III.V on the surface of the substrate by the vapor deposition, (B) heating the substrate obtained at the step (A) at a temperature higher than 550° C. but lower than 750° C. and introducing the gas containing the element of the group V to anneal the film of the compound of the elements of the groups III.V, and (C) maintaining the substrate obtained at the step (B) at a temperature higher than 550° C. but lower than 750° C. and introducing the gas of the organic metal compound of the element of the group III and the gas containing the element of the group V to effect the vapor deposition of a compound semiconductor of the elements of the groups III.V with the film of the III.V compound film obtained at the step (B) being as the nucleus.

13 Claims, 6 Drawing Sheets

OTHER PUBLICATIONS

Kasai et al., ". . . GaAs on Sapphire Grown in Metalorganic Chemical Vapor Deposition," J. Appl. Phys., 60(1), Jul. 1, 1986, pp. 1–5.

Akiyama et al., "Growth of GaAs on Si by MOCVD," J. Crys. Growth, vol. 68, (1984), pp. 21–26.

Manasevit, "Single Crystal Gallium Arsenide on Insulating Substrates", Appl. Phys. Letters, vol. 12 No. 4, Feb. 15, 1968, pp. 156–159.

Kuech et al., "Disilane: A New Silicon Doping Source in Metalorganic Chemical Vapor Deposition of GaAs", Appl. Phys. Lett. 44(10), May 15, 1984, pp. 986–988.

Dapkus et al., "High Purity GaAs Prepared from Trimethylgallium and Arsine", J. Crys. Growth, 55 (1981), pp. 10–23.

GALLIUM ARSENIDE ON SAPPHIRE HETEROSTRUCTURE

This is a continuation of application Ser. No. 020,103, filed on Feb. 27, 1987, now abandoned.

BACKGROUND OF THE INVENTION

1. Field of the Invention

The present invention relates to a process for the vapor deposition of a semiconductor of a compound of elements of the groups III.V, in which a semiconductor of a compound of elements of the groups III.V having an improved electron mobility can be formed on a substrate of a single crystal of alumina by the metal-organic chemical vapor deposition. Furthermore, the present invention relates to a semiconductor element having an improved surface smoothness in a semiconductor layer, which is prepared according to the above-mentioned process.

2. Description of the Prior Art

The technique of utilizing a semiconductor of a compound of elements of the groups III.V for a light-emitting element or light-receiving element has recently been markedly developed, and for example, the technique of forming a semiconductor of a compound of elements of the groups III.V, such as GaAs, on a single crystal substrate by the gas phase epitaxial growth has attracted attention. In the case where a substrate of a single crystal of alumina is used, an advantage is attained in that a high transmission of rays having a wavelength of 0.2 to 5 $\mu$m is obtained, and therefore, application of this semiconductor to various devices is expected. For example, when this semiconductor is used for LED, emission of light from the substrate side is possible, and when the semiconductor is used for a photoelectric conversion device, receipt of light on the side of the substrate is possible.

As means satisfying this demand, there has already been proposed the metal-organic chemical deposition method (ordinarily called "MOCVD method") for forming a GaAs film on a substrate of a single crystal of alumina (Journal of Applied Physics, Vol. 42, No. 6 (1971), page 2519).

More specifically, according to this proposal, a GaAs film is epitaxially grown on a substrate of a single crystal of alumina by the chemical vapor deposition (CVD) method using trimethyl gallium ($Ga(CH_3)_3$) as an organic metal gas and arsine ($AsH_3$) as a reactive gas.

According to this, however, many lattice defects are formed in the interface between the alumina single crystal substrate and the GaAs single crystal film, and therefore, a film thickness larger than 20 $\mu$m is necessary for obtaining a high electron mobility, and improvement of the crystallinity of this film is desired.

Furthermore, according to the conventional process, convexities and concavities are readily formed on the surface of the GaAs film, and the light emission efficiency is drastically reduced in the light-emitting element comprising this semiconductor. When this semiconductor is used for an element of a transistor or IC, fine processing is impossible. Accordingly, utilization of these film devices is inhindered.

Therefore, development of a semiconductor of a compound of elements of the groups III V having a smooth surface is desired, but formation of a semiconductor of a compound of elements of the groups III.V having a smooth surface on a substrate of a single crystal of alumina has not been reported.

SUMMARY OF THE INVENTION

It is therefore a primary object of the present invention to provide a process for the vapor deposition of a semiconductor of a compound of elements of the groups III.V, in which formation of lattice defects in the interface between an alumina single crystal substrate and a film of a semiconductor of a compound of elements of the groups III.V is controlled and even if a compound semiconductor film having a relatively small thickness if formed, a high electron mobility is attained.

Another object of the present invention is to provide a semiconductor element which is characterized in that i forming a semiconductor of a compound of elements of the groups III.V having a smooth surface on an alumina single crystal substrate and using this semiconductor for various film devices such as a light-emitting element and IC, the characteristics of these devices are not degraded by convexities and concavities on the surface of the semiconductor.

Still another object of the present invention is to provide a process for the preparation of a semiconductor element having the above-mentioned excellent property.

More specifically, in accordance with one fundamental aspect of the present invention, there is provided a process for the production of a semiconductor element by introducing a gas of an organic metal compound of an element of the group III and a gas containing an element of the group V into a reaction chamber in which a substrate of a single crystal of alumina is arranged and epitaxially growing a III.V compound semiconductor by the thermal decomposition vapor deposition of the compound of the elements of the groups III.V, said process comprises, in combination, the steps of (A) heating the substrate at a temperature of 400° to 550° C., introducing the gas of the organic metal compound of the element of the group III and the gas containing the element of the group V into the reaction chamber and forming a film of a compound of the elements of the groups III.V on the surface of the substrate by the vapor deposition, (B) heating the substrate obtained at the step (A) at a temperature higher than 550° C. but lower than 750° C. and introducing the gas containing the element of the group V to anneal the film of the compound of the elements of the groups III.V, and (C) maintaining the substrate obtained at the step (B) at a temperature higher than 550° C. but lower than 750° C. and introducing the gas of the organic metal compound of the element of the group III and the gas containing the element of the group V to effect the gas phase growth of a compound semiconductor of the elements of the groups III.V with the film of the III.V compound film obtained at the step (B) being as the nucleus.

In accordance with another aspect of the present invention, there is provided a semiconductor element comprising a single crystal sapphire substrate and a film of a gallium-arsenic semiconductor formed on the substrate by the epitaxial growth, wherein the off angle to the epitaxial growth plane from the plane (0001) of the crystal of the sapphire substrate is larger than 0° but smaller than 5°, the film of the gallium-arsenic semiconductor has a thickness of at least 1 $\mu$m and the surface of the film of the gallium-arsenic semiconductor has such a smoothness that the maximum height roughness is smaller than 0.1 μm (smaller than 0.1 S).

BRIEF DESCRIPTION OF THE DRAWINGS

In FIG. 1, reference numeral represent the following members.

Figure 1:
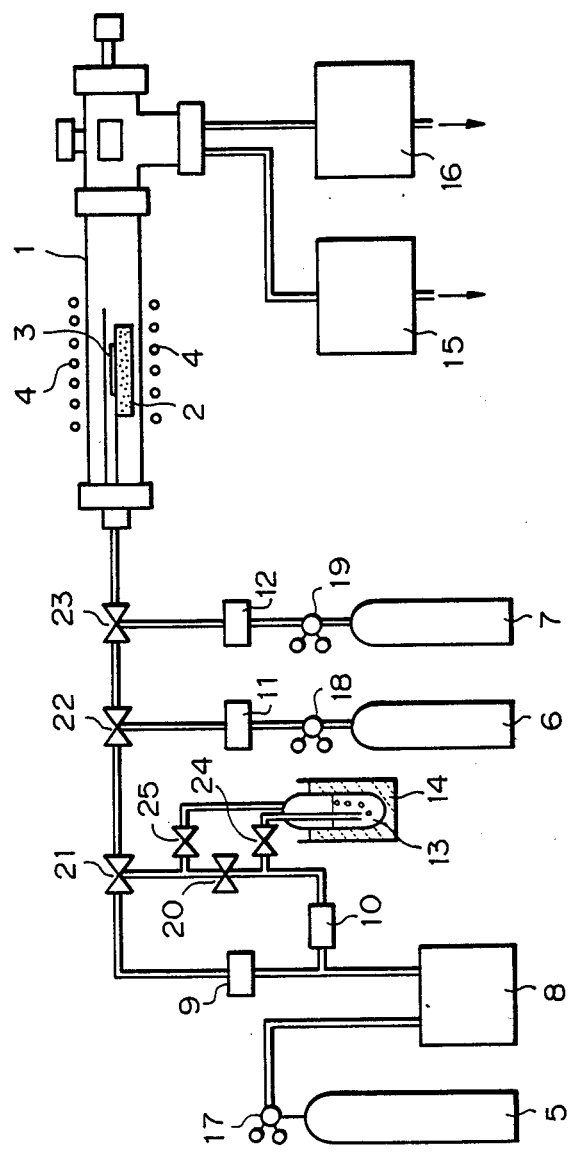
FIG. 1 is a diagram illustrating a CVD apparatus for use in carrying out the process of the present invention.

1: reaction chamber, 2: susceptor, 3: alumina single crystal substrate, 13: bubbler, 14: thermostat tank, 9, 10, 11 and 12: mass flow controllers, a and b: electron mobility curves.

DETAILED DESCRIPTION OF THE PREFERRED EMBODIMENTS

The present invention will now be described in detail with reference to embodiments in which a GaAs film is formed on an alumina single crystal substrate.

The present invention is characterized in that the above-mentioned three steps (A), (B) and (C) are conducted in sequence according to the MOCVD method using a CVD apparatus described hereinafter, and according to the present invention, by dint of this characteristic, a high electron mobility can be attained even if the film thickness is small.

At the step (A), the temperature of the alumina single crystal substrate is set at a level lower than the substrate temperature adopted at the subsequent steps (B) and (C), and a Ga element-containing gas and an As element-containing gas are introduced into a reaction chamber and a nucleus necessary for the growth of a crystal is formed by the CVD method. For this purpose, it is sufficient if the substrate temperature is set at 400° to 550° C., preferably 430° to 530° C. If the substrate temperature is lower than 400° C., the nucleus of GaAs is not grown, and if the substrate temperature exceeds 550° C., a homogeneous nucleus is not grown and defects are formed in the interface.

It is preferred that the thickness of the film formed at the step (A) be 100 to 700Å, though the preferred thickness differs to some extent according to the heat annealing conditions at the step (B).

At the step (B), the GaAs film formed at the step (A) is heat-annealed to improve the crystallinity of GaAs. The substrate temperature necessary for this heat annealing is higher than 50° C. but lower than 750° C., preferably from 570° to 730° C. If the substrate temperature is outside this range, the electron mobility is not improved. If the substrate temperature is elevated, the vapor pressure of As of the GaAs film is elevated and therefore, it is necessary to introduce the As element-containing gas into the reaction chamber. The annealing time is generally 0.1 to 100 minutes and preferably 1 to 80 minutes.

At the subsequent step (C), a crystal of GaAs is grown of the GaAs film having improved crystallinity. Namely, the Gas element-containing gas and As element-containing gas are introduced into the reaction chamber, and the substrate temperature is set at a temperature higher than 550° C. but lower than 750° C., preferably 570° to 730° C., whereby these gases are thermally decomposed and the epitaxial growth of GaAs is effected on the GaAs film grown at the step (A).

In the present invention, a gas of a trialkyl gallium such as $Ga(CH_3)_3$ or $Ga(C_2H_5)_3$ is sued as the Ga element-containing gas, and a gas of $AsH_3$ or $AsCl_3$ is used as the Gas element-containing gas. As the carrier gas, there may be used $H_2$ or an inert gas (Ar, $N_2$, He, Ne or the like). Of course, if desired, a minute amount of a gaseous compound of a doping element, such as a silane, may be incorporated into the gas to be supplied.

In the present invention, in order to further improve the crystallinity of GaAs, the following preparation conditions may be adopted to the steps (A), (B) and (C).

Namely, at the step (A), it is preferred that the molar volume ratio of the As element-containing gas introduced into the reaction chamber to the Ga element-containing gas introduced into the reaction chamber (hereinafter referred to as "(As)/(Ga) ratio") be at least 10, especially 50 to 200, and the total gas pressure within the reaction chamber to set at 50 to 760 Torr.

At the step (B), it is preferred that the amount of the As element-containing gas be set at 0.1 to 5% by volume, especially 0.5 to 2% by volume, based on the total amount.

At the step (C), it is preferred that the (As)/(Ga) ratio and the total gas pressure be the same as those adopted at the step (A). It also is preferred that the growth of GaAs be effected so that the total thickness of the GaAs film is at least 1 μm, especially at least 3 μm.

Incidentally, in each of the examples given hereinafter, at the step (C), $Si_2H_6$ gas is introduced into the reaction chamber as well as the reactive gases and carrier gas to incorporate 0.01 to 1 ppm of Si into GaAs during the growth, and the electron mobility of the film is determined.

The CVD apparatus for sue in carrying out the process of the present invention will now be described in detail with reference to the accompanying drawings.

FIG. 1 illustrates a CVD apparatus of the radio frequency inductive heating type. A susceptor 2 is arranged in a reaction chamber 1, and an alumina single crystal substrate 3 for forming a GaAs film thereon is mounted on the susceptor 2. A high frequency coil 4 is wound around the reaction chamber 1 and a high frequency power source (not shown) is connected to the coil 4 so that when a high frequency power is applied to the high frequency coil 4, the susceptor 2 is induction-heated.

A diluting gas such as $H_2$ or Ar is sealed in a first tank 5, an As element-containing gas is sealed in a second tank 6 and $Si_2H_6$ gas is sealed in a third tank 7. The diluting gas from the first tank 5 is passed through a refiner 8 and the refined gas is supplied as a carrier gas. The flow rate of this gas is adjusted by mass flow controllers 9 and 10. The flow rates of the gases released from the second tank 6 and third tank 7 are adjusted by mass flow controllers 11 and 12. Reference numeral 13 represents a bubbler filled with a Ga element-containing liquid substance such as Ga(CH$_3$)$_3$, and reference numeral 14 represents a thermostat tank for maintaining the bubbler 13 at a predetermined temperature. The diluting gas in the first tank 5 is passed through the refiner 8 and introduced into the bubbler 13 by the mass flow controller 10, whereby the liquid substance in the bubbler 13 is gasified and is introduced into the reaction chamber 1. Furthermore, the diluting gas is released through the mass flow controller 9 and is sued as the carrier gas for the gases in the second tank 6 and third tank 7. A super high vacuum exhauster 15 and an exhaust gas treating device 16 are connected to the reaction chamber 1. Vacuum gas discharge is performed within the reaction chamber 1 before formation of the film by using the super high vacuum exhauster 15 to remove the residual gas in the reaction chamber 1, and the As compound in the exhaust gas is removed by the exhaust gas treating device 16. Incidentally, each of reference numerals 17, 18 and 19 represents a gas-adjusting valve of the tank and each of reference numerals 20, 21, 22, 23, 24 and 25 represents a valve.

In the CVD apparatus having the above-mentioned structure, before the steps (A) through (C), the substrate 3 which has been subjected to a predetermined cleaning treatment is fixed on the susceptor 2 so that the cleaned surface of the substrate 3 is located above, and the interior of the reaction chamber 1 is evacuated to about $10^{-7}$ Torr and the substrate 3 is induction-heated by the high frequency coil 4. If the substrate 3 is heated to a predetermined temperature, this temperature is maintained. Subsequently, the gas-adjusting valve 17 of the first tank 5 is opened and the valves 21, 22 and 23 are fully opened, and the flow rate of the diluting gas is set at a predetermined level by the mass flow controller 9 and the diluting gas is introduced into the reaction chamber 1.

Then, at the step (A), the gas-adjusting valve 18 of the second tank 6 is opened and the As element-containing gas is supplied while adjusting the flow rate to a predetermined value by the mass flow controller 11. Furthermore, the valve 20 is closed and the valves 24 and 25 are fully opened, and the diluting gas is introduced into the bubbler 13 to obtain a Ga element-containing gas. The feed rate of tis gas can be set by the pressure in the bubbler 13, which is determined by the temperature of the thermostat tank 14 and the flow rate of the diluting gas set by the mass flow controller 10.

At the subsequent step (B), the valves 20 and 24 are closed so that the Ga element-containing gas is not used, and the temperature is elevated to a level higher than the substrate temperature at the step (A) by induction heating.

Then, at the step (C), the valves 20 and 24 are fully opened again to introduce the Ga element-containing gas into the reaction chamber 1 and grow a crystal of GaAs. Incidentally, in the measurement of the electron-mobility, in order to incorporate a minute amount of Si into this GaAs, the gas-adjusting valve 19 of the third tank 7 is filled with Si$_2$H$_6$ gas is fully opened and a predetermined amount of Si$_2$H$_6$ gas is fed into the reaction chamber 1 while adjusting the flow rate by the mass flow controller 12.

According to the present invention, the film formed at the step (A) is annealed and crystallized at the step (B), and at the step (C), the semiconductor film is epitaxially grown, whereby formation of lattice defects in the interface between the substrate and the semiconductor film is controlled and a high electron mobility is obtained even if the film thickness is relatively small.

Figure 2:
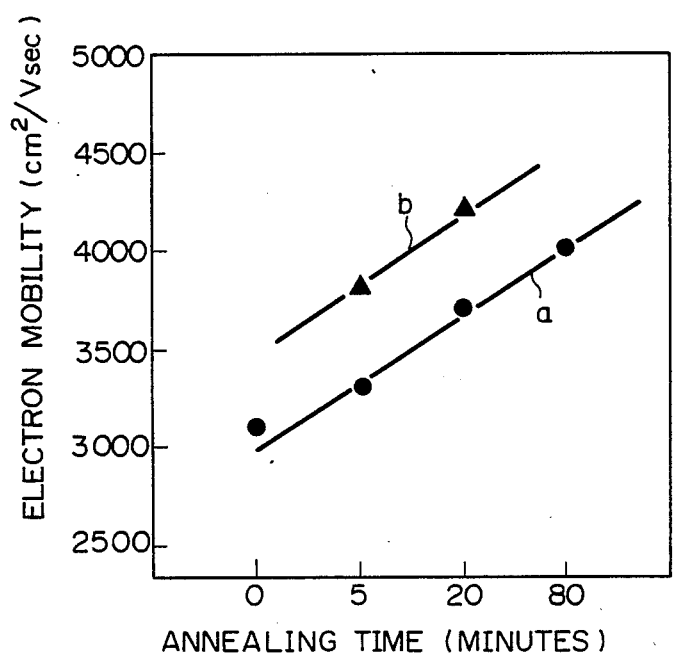
FIG. 2 shows curves illustrating the relations between the electron mobility and the annealing time, observed in the examples of the present invention.

FIG. 2 illustrates the relation between the annealing time at the step (B) and the electron mobility of the element in Example 1 described hereinafter. From FIG. 2, it is seen that the electron mobility is assuredly increased by annealing.

The gallium-arsenic semiconductor of the present invention has an electron mobility of 3500 to 4500 cm$^2$/Vsec in the state doped with Si$_2$H$_6$ when the film thickness is, for example, 6 $\mu$m.

In accordance with one preferred embodiment of the present invention, a sapphire single crystal substrate is used as the alumina single crystal substrate and the epitaxial growth of a GaAs semiconductor is performed so that the off angle $\theta$ to the epitaxial growth plane of the semiconductor from the plane (0001) of the substrate is larger than 0° but smaller than 5°, preferably 0.5 to 4°, especially preferably about 2°. If the off angle is set within the above-mentioned range, the surface smoothness of the GaAs semiconductor is prominently improved.

Figure 3:
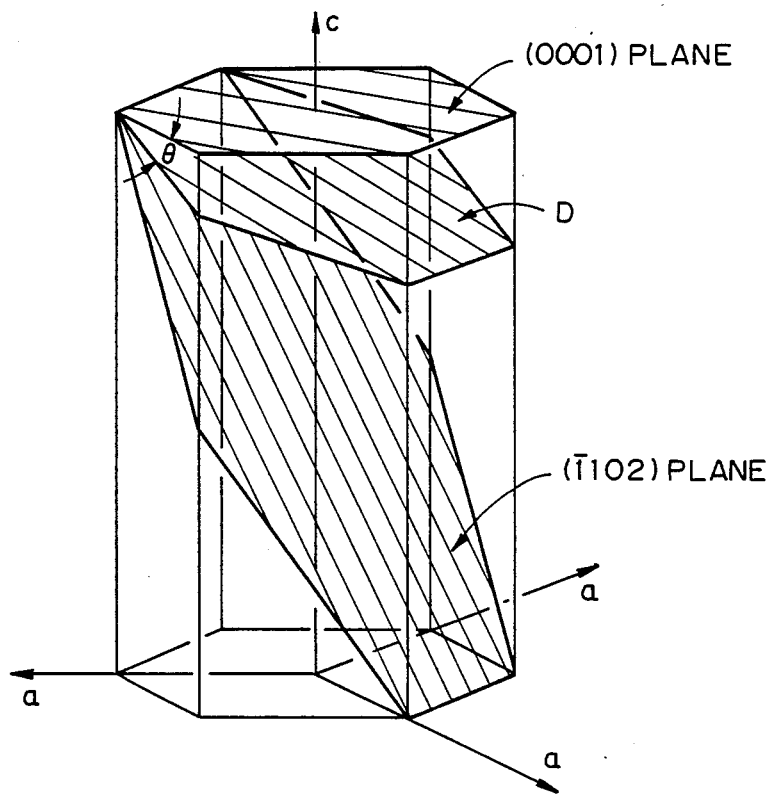
FIG. 3 is a diagram illustrating the off angle to the epitaxial growth plane from the plane (0001) of the crystal sapphire substrate.

Referring to FIG. 3 illustrating the plane azimouth of the sapphire single crystal substrate, which is of the hexagonal system, the plane (0001) (generally called "plane C") is present in the direction rectangular to the c-axis of the crystal, and the epitaxial growth plane D is set at an off angle $\theta$ toward the plane ($\bar{1}$102) (generally called "plane D") from this plane C.

This setting of the epitaxial growth plane D is accomplished by chamfering an existent sapphire substrate by a diamond cutting tool so that the GaAs-adhering plane of the single crystal substrate has a predetermined off angle from the plane (0001) of the single crystal. Preferably, in preparing a sapphire substrate by the Edge-defined Film-fed Growth method (EFG method), a single crystal is grown so that the surface of the sapphire substrate has a predetermined off angle to the plane (0001) of the sapphire crystal, whereby a sapphire substrate to be used in this preferred embodiment can be obtained. More specifically, high-purity alumina is fused in an inert atmosphere and a molybdenum die for the growth of a ribbon-like sapphire single crystal, which has a split in the interior thereof, is located so that the die falls in contact with the melt. The alumina melt is caused to rise to the top end portion of the die by the capillary action, and a sapphire seed having predetermined azumith and size is brought into contact with the alumina melt on the top end portion of the die. Then, the seed is pulled up to effect the growth of a sapphire single crystal. By deviating the sapphire seed from the die slit by the above-mentioned off angle $\theta$ in the transverse direction, a sapphire single crystal substrate to be used in this embodiment can be obtained.

According to the present invention, by adjusting the off angle to the epitaxial growth plane on the sapphire substrate within the above-mentioned range, it is possible to impart such a surface smoothness as defined by a maximum height roughness smaller than 0.1 $\mu$m (smaller than 0.1 S), especially smaller than 0.05 $\mu$m, to the formed gallium-arsenic semiconductor. FIGS. 7, 8, 9 and 10 are electron microscope photographs of the surface of GaAs films formed at off angles of 0.5°, 2°, 4° and 6°, respectively, in Example 4 given hereinafter. It is seen that if the off angle is 0.5 to 4°, especially about 2°, the surface smoothness is prominently excellent.

In this embodiment of the present invention, by adjusting the substrate temperature at 600° to 640° C., especially 610° to 630° C., at the step (C), that is, at the epitaxial growth step, while adjusting the off angle of the epitaxial growth plane within the above-mentioned range, the surface smoothness of the GaAs film can be further prominently improved. If the substrate temperature is lower than 600° C., fine dents are formed on the entire surface of the film, and if the substrate temperature exceeds 640° C., gentle convexities are formed on the entire surfaces.

Figure 4:
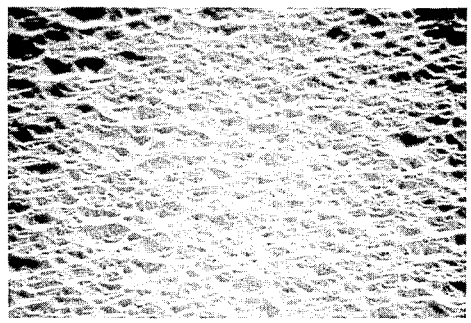
FIGS. 4 through 6 are electron microscope photographs of the surfaces of GaAs epitaxial films obtained by maintaining the substrate at 590° C., 620° C. and 650° C., respectively, in the examples of the present invention.
Figure 5:
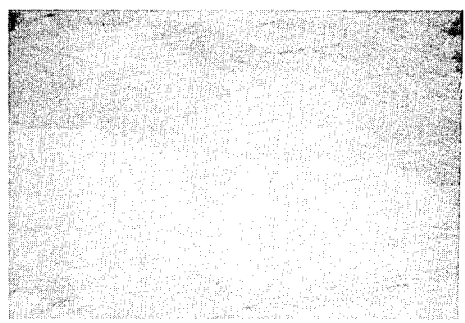
Figure 6:
Figure 7:
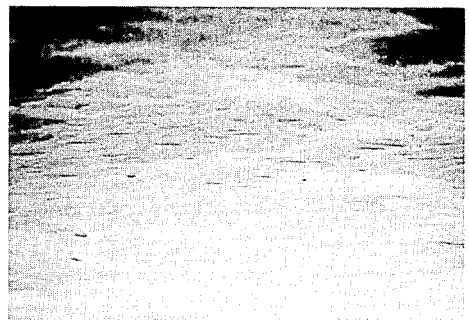
FIGS. 7 through 10 are electron microscope photographs of the surfaces of GaAs epitaxial films obtained by setting the epitaxial growth plane of the substrate at 0.5°, 2°, 4° and 6°, respectively, in the examples of the present invention.
Figure 8:
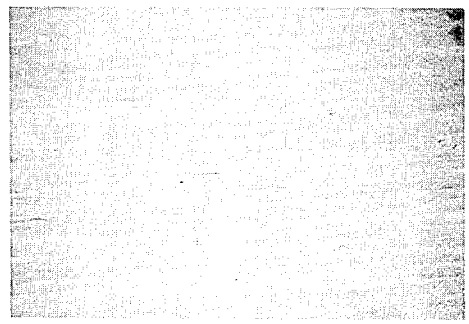
Figure 9:
Figure 10:
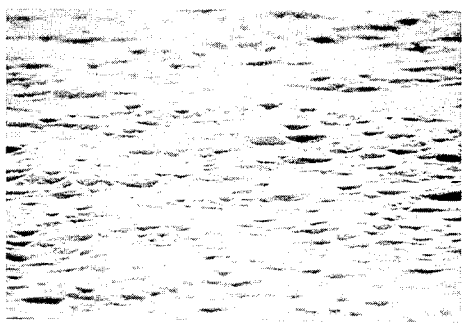

FIGS. 4, 5 and 6 are electron microscope photographs of the surfaces of epitaxial films formed at substrate temperatures of 590° C., 620° C. and 650° C., respectively, in Example 3 given hereinafter. It is seen that the film of FIG. 5 (620° C.) is excellent in the surface smoothness.

As is apparent from the foregoing description, according to the present invention, since the three-stepped growth process including heat annealing is adopted, the electron mobility can be increased even if the thickness of the grown epitaxial film is small, and therefore, a high-quality film electronic device can be provided at a high manufacturing efficiency and a reduced manufacturing cost.

Furthermore, according to the present invention, since the epitaxial growth surface of the formed semiconductor has a good smoothness, if this semiconductor element is used as a light-emitting element, the light emission efficiency can be increased. Moreover, if the semiconductor element of the present invention is used as an element of a transistor or IC, since fine processing can be performed on the surface of the film of the semiconductor, various film devices can be manufactured. The semiconductor element of the present invention can be especially advantageously applied to the production of a photocoupler. Still further, according to the preparation process of the present invention, a semiconductor element excellent in the surface smoothness can be obtained only by controlling the growth temperature of the substrate having an epitaxial growth plane and the off angle of this growth plane within predetermined ranges. Accordingly, the production can be easily controlled, and the quality is stabilized and the production yield is increased.

Incidentally, in the foregoing illustration, the epitaxial growth of the GaAs film alone has been described. However, as is obvious to those skilled in the art, similar advantages can be attained if the present invention is applied to the production of semiconductors having a part of GaAs substituted by Al, P or In, such as $Ga_xAl_{1-x}As$, $GaAs_xP_{1-x}$ and $Ga_xIn_{1-x}As$, and other III.V compound semiconductors.

The present invention will now be described in detail with reference to the following examples that by no means limit the scope of the invention.

EXAMPLE 1

By using the CVD apparatus shown in FIG. 1, a GaAs film was formed on an alumina single crystal substrate and the electron mobility was measured.

More specifically, a C-plane alumina single crystal substrate was set on the susceptor 2, and at the step (A), $H_2$ gas was introduced from the first tank 5 and $AsH_3$ gas was introduced at a flow rate of 30 sccM from the second tank 6 to the reaction chamber 1. Bubbling hydrogen was introduced into the bubbler 13 through the mass flow controller 11 to gasify liquid $Ga(CH_3)_3$. The $Ga(CH_3)_3$ gas was introduced at a flow rate of 0.6 sccM into the reaction chamber 1. The flow rate of all the gases introduced into the reaction chamber 1 was set at 3500 sccM, the substrate temperature was set at 470° C. and the total reaction pressure was set at 100 Torr, and gas phase growth was conducted for 1 minute under these conditions. Thus, a GaAs film having a thickness of 400 Å was formed at the step (A).

At the subsequent step (B), the substrate temperature was set at 620° C., and the valves 20 and 24 were closed to reduce the flow rate of the $Ga(CH_3)_3$ to zero. Other conditions were the same as at the step (A), and heat annealing was carried out. In this example, the annealing time was changed as shown in FIG. 2, and the electron mobility of the GaAs film obtained at the subsequent step (C) was measured.

At the step (C), the valves 20 and 24 were opened, and the $Ga(CH_3)_3$ gas and $AsH_3$ gas were introduced into the reaction chamber 1 at flow rates of 1.2 sccM and 96 cssM, respectively. Simultaneously, $Si_2H_6$ gas was introduced at a flow rate of 10 or 25 sccM into the reaction vessel 1 from the third tank 7 ($Si_2H_6$ was contained at 2 ppm in $H_2$). Other conditions were the same as at the step (B). Thus, a GaAs film having a thickness of 6 μm was grown on the GaAs film obtained at the step (A).

With respect to GaAs epitaxial films obtained according to the above-mentioned procedures while changing the annealing time at the step (B), the electron mobility at room temperature was measured. The obtained results are shown in FIG. 2. Incidentally, this electron mobility was determined by measuring the Hall effect.

In FIG. 2, marks and show the results obtained at the $Si_2H_6$ gas flow rates of 10 sccM and 25 sccM, respectively, and a and b are electron mobility curves obtained at these flow rates, respectively. In this example, the electron densities of the GaAs films obtained at the $Si_2H_6$ gas flow rates of 10 sccM and 25 sccM were about $1.5 \times 10^{16}/cm^3$ and about $4 \times 10^{16}/cm^3$, respectively.

From FIG. 2, it is seen that the electron mobility increases with increase of the annealing time. Accordingly, it is considered that the crystallinity of the GaAs film obtained at the step (A) is improved depending upon the logarithm of the annealing time and the electron mobility of the GaAs epitaxial film grown on this film is correspondingly increased.

In case of a GaAs epitaxial film (having a thickness of 6 μm) grown by conducting only the step (C) without performing the steps (A) and (B) in this example, the electron mobility was about 2500 cm²/Vsec. Accordingly, it is understood that if the steps (A), (B) and (C) are performed according to the present invention, the electron mobility is prominently increased.

EXAMPLE 2

In this example, the thickness of the GaAs film formed at the step (A) was changed and the electron mobility was measured.

GaAs epitaxial films were prepared in the same manner as in Example 1 except that the $Si_2H_6$ gas flow rate at the step (C) was set at 10 sccM and the annealing time was set at 20 minutes, and the electron mobility was measured. The obtained results are shown in Table 1. Incidentally, in each of the samples shown in Table 1, the electron density was about $1.5 \times 10^{16}/cm^3$.

TABLE 1

| Film Thickness (Å) | Electron Mobility (cm²/Vsec) |
|---|---|
| 200 | 3500 |
| 400 | 3800 |

TABLE 1-continued

| Film Thickness (Å) | Electron Mobility (cm²/Vsec) |
|---|---|
| 600 | 3300 |

As is apparent from Table 1, if the film thickness is within the range of from 100 to 700 Å, the electron mobility is prominently improved.

EXAMPLE 3

By using the CVD apparatus shown in FIG. 1, three GaAs epitaxial films were formed according to the abovementioned three-stepped growth process while adjusting the substrate temperature to 590° C., 620° C. and 650° C., respectively, at the steps (B) and (C), and the surface stages of these GaAs films were examined.

More specifically, a C-plane alumina single crystal (the off angle of the epitaxial growth plane of the substrate was 0.5°) was set on the susceptor 2. At the step (A), H$_2$ gas was introduced into the reaction chamber 1 from the first tank 5 and AsH$_3$ gas was introduced at a flow rate of 30 sccM into the reaction chamber 1 from the second tank 6. Bubbling hydrogen was introduced into the bubbler 13 through the mass flow controller 11 to gasify liquid Ga(CH$_3$)$_3$, and the Ga(CH$_3$)$_3$ gas was introduced at a flow rate of 0.6 sccM into the reaction chamber 1. The flow rate of all the gases introduced into the reaction chamber 1 was set at 3500 sccM, the substrate temperature was set at 470° C. and the reaction pressure was set at 100 Torr, and the gas phase growth was carried out for 1 minute under these conditions. Thus, a GaAs film having a thickness of 400 Å was formed at the step (A).

At the subsequent step (B), the substrate temperature was set at 590° C., 620 ℞ C. or 650° C., and the valves 20 and 24 were closed to reduce the flow rate of the Ga(CH$_3$)$_3$ to zero. Other conditions were the same as at the step (A), and heat annealing was carried out for 5 minutes.

At the step (C), the valves 20 and 24 were opened, and the Ga(CH$_3$)$_3$ gas and AsH$_3$ gas were introduced into the reaction chamber 1 at the flow rates of 1.2 sccM and 96 sccM, respectively. Other conditions were the same as at the step (B) and the substrate temperature was the same as at the step (B). Thus, a GaAs film having a thickness of 6 μm was epitaxially grown on the GaAs film formed at the step (A).

The surface of the so-obtained GaAs epitaxial film was photographed at an inclination angle of 60° from the sample surface by a scanning type electron microscope. Photographs of the samples obtained at the substrate temperatures of 590° C., 620° C. and 650° C. are shown in FIGS. 4, 5 and 6, respectively. In each photograph, the magnifying factor was 2500 magnifications.

As is apparent from FIGS. 4 through 6, an excellent surface smoothness was obtained at the substrate temperature of 620° C. (FIG. 5), while fine dents or convexities and concavities were formed at the substrate temperature of 590° C. (FIG. 4) or 650° C. (FIG. 6).

The surface roughness of the GaAs films shown in FIGS. 4 through 6, measured by a surface roughness meter, were 0.3 S, 0.08 S and 1.0 S, respectively.

EXAMPLE 4

The crystal growth was performed on a C-plane alumina single crystal substrate while adjusting the off angle of the epitaxial growth plane to 0.5°, 2°, 4° and 6°, and the surface states of GaAs epitaxial films were examined.

More specifically, four substrates differing in the off angle of the epitaxial growth plane as mentioned above were prepared, and on each of these substrates, a GaAs epitaxial film was formed under the same conditions as adopted in Example 3 except that the substrate temperature at the steps (B) and (C) was set at 20° C. The surfaces of the obtained films were photographed at an inclination angle of 75° from the sample surface by using a scanning type electron microscope. Photos of the samples obtained at the off angles of 0.5°, 2°, 4° and 6° are shown in FIGS. 7, 8, 9 and 10, respectively. In each photo, the magnifying factor was 2500 magnifications.

From FIGS. 7 through 10, it is seen that each of the samples obtained at the off angles of 0.5°, 2° and 4° (FIGS. 7 through 9) had a good surface smooth and the sample obtained at the off angle of 2° (FIG. 8) was especially excellent in the surface smoothness. On the other hand, convexities and concavities were apparently observed on the surface of the sample obtained at the off angle of 4° (FIG. 4).

The surface roughness of the GaAs films shown in FIGS. 7 through 10, measured by a surface roughness meter, were 0.08 S, 0.03 S, 0.08 S and 0.3 S, respectively.

We claim:

1. A semiconductor element comprising a single crystal sapphire substrate and a film of a gallium-arsenic semiconductor formed on the substrate by the epitaxial growth, wherein the off angle to the epitaxial growth plane from the plane (0001) of the crystal of the sapphire substrate is greater or equal to 0.5° but smaller than 5°, the film of the gallium-arsenic semiconductor has a thickness of at least 1 μm and the surface of the film of the gallium-arsenic semiconductor has such a smoothness that the maximum height roughness is smaller than 0.1 μm (smaller than 0.1 S).

2. A semiconductor element as set forth in claim 1, wherein said off angle is in the range of from 0.5° to 4°.

3. A semiconductor element as set forth in claim 1, wherein the maximum height roughness of the surface of the gallium-arsenic semiconductor is smaller than 0.05 μm.

4. A semiconductor element as set forth in claim 1, wherein the gallium-arsenic semiconductor film has an electron mobility of 3500 to 4500 cm²/Vsec in the state doped with Si$_2$H$_6$.

5. A semiconductor element as set forth in claim 1, wherein the film of the gallium-arsenic semiconductor has a thickness of 6 μm or less.

6. A semiconductor element comprising a single crystal sapphire substrate, a first semiconductor film of an annealed compound of elements of the groups III.V formed on the substrate by epitaxial growth and a second semiconductor film of a compound of elements of the groups III.V formed on the first semiconductor film by epitaxial growth.

7. The semiconductor element of claim 6 wherein the first and second semiconductor films comprise gallium-arsenic.

8. The semiconductor element of claim 6 wherein the first semiconductor is annealed for a period of from 0.1 to 100 minutes.

9. The semiconductor element of claim 8 wherein the first semiconductor film is annealed for a period of from 1 to 80 minutes.

10. The semiconductor element of claim 6 wherein the first semiconductor film is formed at a temperature of 400° to 550° C.

11. The semiconductor element of claim 10 wherein the second semiconductor film is formed at a temperature of 550° to 750° C.

12. The semiconductor element of claim 6 wherein the off angle to the epitaxial growth plane from the plane (0001) of the crystal of the sapphire substrate is greater or equal to 0.5° but smaller than 5°.

13. The semiconductor element of claim 12 wherein said off angle is in the range of from 0.5° to 4°.

* * * * *